United States Patent
Ramamoorthy et al.

(10) Patent No.: US 8,004,345 B2
(45) Date of Patent: Aug. 23, 2011

(54) MINIMIZING NON-LINEARITY ERRORS

(75) Inventors: Navin Kumar Ramamoorthy, Bangalore (IN); Umesh K Shukla, Bangalore (IN); K. S. Sankara Reddy, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 12/491,514

(22) Filed: Jun. 25, 2009

(65) Prior Publication Data

US 2010/0327950 A1    Dec. 30, 2010

(51) Int. Cl.
*H01L 35/00* (2006.01)
*H01L 37/00* (2006.01)
*H03K 3/42* (2006.01)
*H03K 17/78* (2006.01)

(52) U.S. Cl. .................................................. 327/513
(58) Field of Classification Search ............... 327/513
See application file for complete search history.

(56) References Cited

U.S. PATENT DOCUMENTS

| | | | |
|---|---|---|---|
| 7,812,661 B2 * | 10/2010 | Wu et al. | 327/513 |
| 7,834,705 B2 * | 11/2010 | Seo et al. | 331/2 |
| 2007/0018713 A1 | 1/2007 | Tripathi et al. | |

OTHER PUBLICATIONS

Qadeer A. Khan, et al., "Techniques for on-chip process voltage and temperature detection and compensation", pp. 1-6.

* cited by examiner

*Primary Examiner* — Lincoln Donovan
*Assistant Examiner* — Daniel Rojas
(74) *Attorney, Agent, or Firm* — Jeffrey P. Aiello

(57) ABSTRACT

A system and method for minimizing non-linearity errors induced in output drive voltage of a transmitter circuit due to on-chip process, voltage, and temperature (PVT) variations. The system including an oscillator for converting an input reference bias voltage into a clock output signal, where the input reference bias voltage varies in response to PVT variations. Also included is a counter for counting the clock output signal and generating a count value corresponding to the clock output of the oscillator. A comparison module operatively coupled to the counter compares the count value with a pre-simulated count value to generate an error signal. Based on the error signal generated by the comparison module, a correction logic adjusts an output drive signal of the transmitter circuit making it immune to PVT variations.

14 Claims, 8 Drawing Sheets

MINIMIZING NON-LINEARITY ERRORS

TRADEMARKS

IBM® is a registered trademark of International Business Machines Corporation, Armonk, N.Y., U.S.A. Other names used herein may be registered trademarks, trademarks or product names of International Business Machines Corporation or other companies.

TECHNICAL FIELD

Embodiments of the invention relate generally to performance parameters of integrated circuits (ICs), and more specifically, to on-chip process, voltage, and temperature (PVT) variations in a transmitter circuit.

BACKGROUND OF THE INVENTION

Integrated circuit (IC) feature sizes are shrinking steadily into the sub-100 nm range, resulting in increased sensitivity of an IC to on-chip process, voltage, and temperature (PVT) variations. This, in turn, hampers IC performance as well as IC fabrication yields. In general, ICs are fabricated and expected to operate under nominal PVT corner; however, after or during fabrication the PVT parameters inevitably drift from their nominal values. These PVT variations cause various critical circuit performance parameters to deviate from their expected nominal behavior, such as delay, linearity, input/output impedances, static power dissipation, and other performance parameters well known in the art.

On-chip PVT variations can cause fabricated chips to fall short of their performance requirements and significantly lower the overall yield of the chips. Under nominal PVT conditions, a typical IC, such as a Serializer/Deserializer (SerDes) transmitter circuit, exhibits a linear output voltage response. After fabrication however, PVT variations induce non-linearity errors in the output voltage response of the IC. Two main contributors to on-chip variability are changes in process parameters, and changes in operating temperatures. Process parameter variations can occur due to proximity effects in photolithography, non-uniform conditions during deposition, random dopant fluctuations, etc., resulting in fluctuations in parameters such as channel length and width, oxide thickness, dopant concentrations, and threshold voltage. Changes in operating temperatures stem from variations in heat dissipation, leading to a decrease in charge carrier mobility, which in turn causes a direct decrease in current and circuit speed reduction. Moreover, an increase in the operating temperature can also lead to increase in leakage current.

As a result of PVT variations, an IC may require tuning after fabrication. While the effects of process parameters require one-time compensation immediately after the transmitter is fabricated, thermal variations are dependent on the operating environment and as a result the transmitter require an adaptive on-chip circuit that monitors the PVT variations and performs a runtime compensation to minimize the variations. Thus, existing measures fail to address the full scope of the issues raised by PVT variations.

SUMMARY OF THE INVENTION

In one embodiment, an adaptive circuit for minimizing non-linearity errors induced in output drive voltage of a transmitter circuit due to on-chip process, voltage and temperature (PVT) variations. The adaptive circuit includes an oscillator, a counter, a comparison module and a correction logic, operatively coupled. The oscillator converts an input reference bias voltage into a clock output. The input reference bias voltage varies in response to the PVT variations and frequency of the clock output varies according to changes in the input reference bias voltage. The counter receives input from the oscillator and generates a count value corresponding to the clock output of the oscillator. The comparison module is configured to compare the count value with a pre-simulated count value to generate an error signal. Using the error signal, the correction logic module adjusts output drive signal, which compensates the PVT variations.

In another embodiment, a method for minimizing non-linearity errors induced in output drive voltage of a transmitter circuit due to process, voltage, and temperature (PVT) variations. The method includes generating a clock output signal from an input reference bias voltage, wherein frequency of the clock output signal varies in response to the PVT variations. The method also includes counting the clock output signal to generate a count value and comparing the count value with a pre-simulated count value to compute an error signal. Further, based upon the generated error signal the method includes adjusting output drive signal, which compensates the PVT variations.

DETAILED DESCRIPTION OF THE INVENTION

The following detailed description is made with reference to the figures. Preferred embodiments are described to illustrate the invention, not to limit its scope, which is defined by the claims. Those of ordinary skill in the art will recognize a number of equivalent variations on the description that follows.

Figure 1:
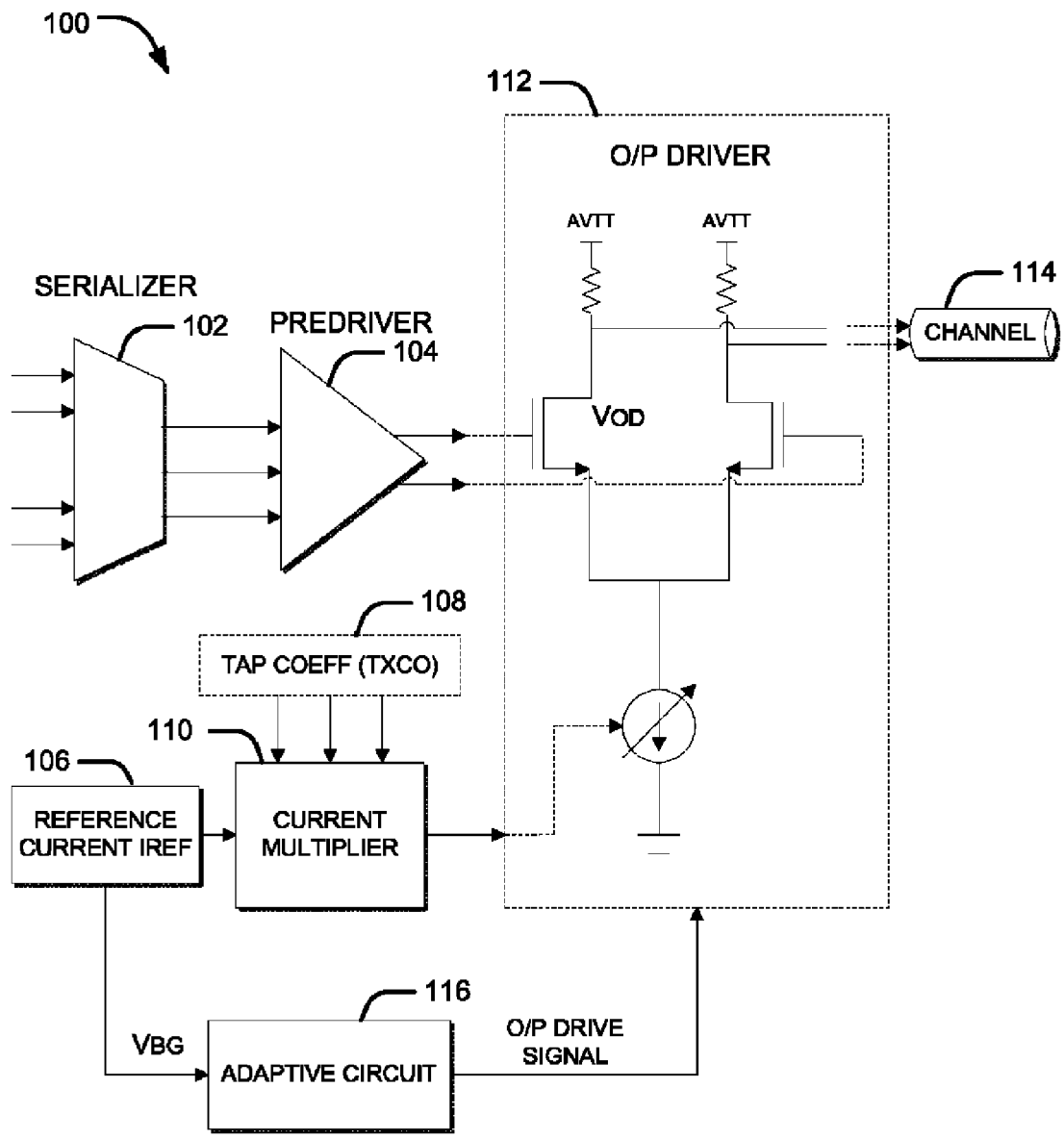
FIG. 1 illustrates a block diagram of an embodiment of a transmitter employed in communication systems.

Referring now to the drawings, FIG. 1 sets out a block diagram of an embodiment of a transmitter 100 employed in communication systems. The transmitter 100 is included in a high speed serial link Serializer/Deserializer (SerDes) core. A conventional SerDes transmitter is an integrated circuit (IC) employed in high-speed communication devices for converting parallel data to serial data. The transmitter 100 includes a serializer 102, a predriver 104, a reference current generator 106, a tap coefficient module 108, a current multiplier 110, an output (O/P) driver 112, and a channel 114. These elements are all conventional and all perform functions known and understood by those in the art; therefore, these components will not be discussed further here. The terms "transmitter" and "SerDes transmitter" are used interchangeably in the following discussion. The invention is discussed herein with reference to a SerDes transmitter, but those skilled in the art will appreciate that the invention may be applicable to any IC which is affected by process, voltage, and temperature (PVT) variations.

In general, output voltage of a SerDes transmitter exhibits a linear curve with respect to input parameters. In FIG. 1, differential voltage $V_{OD}$ of output serial data of the transmitter 100 varies linearly as a function of its input tap coefficient settings (TXCO). On-chip PVT variations, however, induce non-linearity errors in the output voltage response of the transmitter 100. The terms "PVT variations" and "on-chip PVT variations" are interchangeably used in the following sections. Typically, PVT parameters vary from best case performance corner to worst case performance corner, as known to those skilled in the art, and these PVT corners are industry set standards. For each IC, a nominal corner exists that corresponds to an optimized PVT corner yielding an optimized performance by the IC. The transmitter 100 exhibits a linear output voltage response at a nominal PVT corner. In general, PVT variations are represented using a Gaussian distribution curve, where the nominal PVT corner exists at zero skew. A skew of +3 or +6 measured from the nominal corner indicates the best case performance corner and −3 or −6 skew from the nominal corner indicates the worst case performance corner, for example.

The transmitter 100 includes an adaptive circuit 116 that senses non-linearity errors in the output voltage and acts to minimize those errors. This circuit allows the transmitter 100 to produce a linear output voltage for any PVT condition. The adaptive circuit 116 will be discussed in detail in connection with FIGS. 2-7, but in brief the adaptive circuit 116 receives input $V_{BG}$ from the reference current generator 106, and it dynamically adjusts an output drive signal supplied to the O/P driver 112, and the output drive signal compensates for PVT variations.

The adaptive circuit 116 can be implemented in a number of forms, and the following sections set out a number of examples showing specific embodiments for such a circuit. It will be understood that the following descriptions are not intended to be exhaustive, and those of skill in the art will recognize other variations possible within the ambit of the claims, which solely define the invention.

Figure 2:
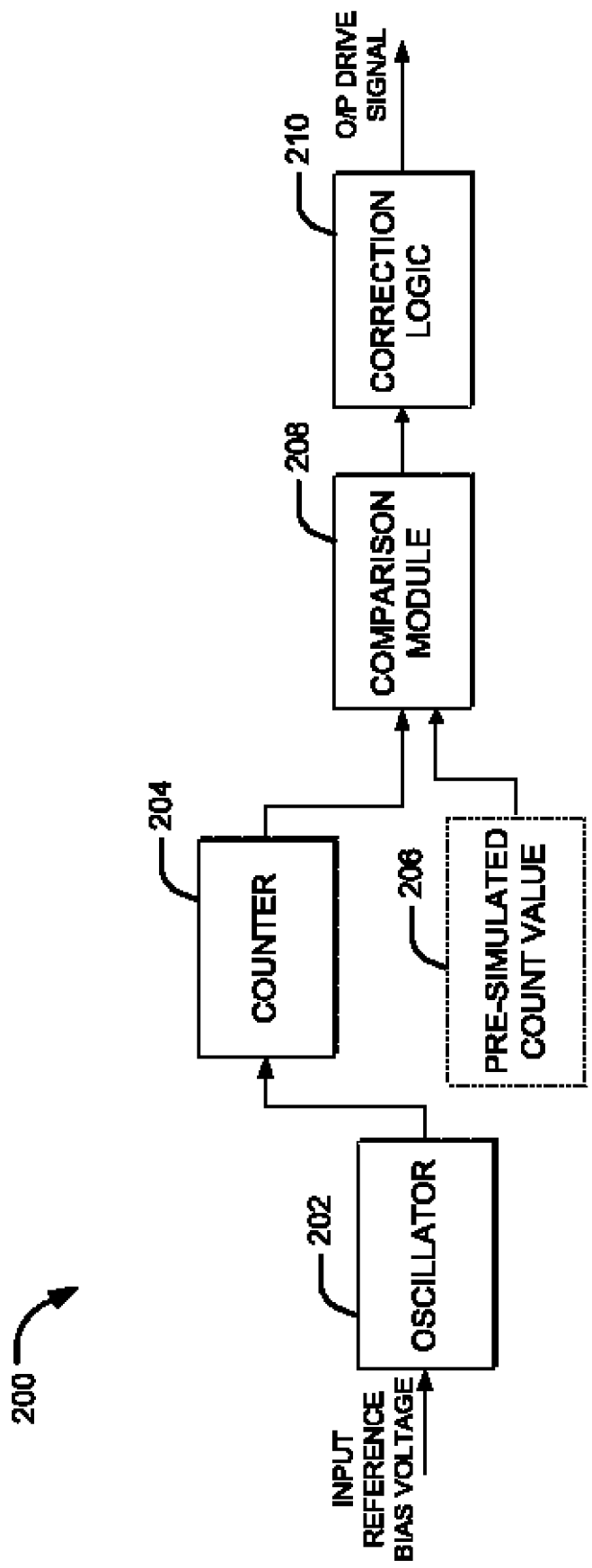
FIG. 2 illustrates a block diagram of an embodiment of an adaptive circuit for minimizing effects of on-chip PVT variations on the performance parameters of a transmitter.

A first such implementation is seen in FIG. 2, a block diagram of an adaptive circuit 200 for minimizing effects of on-chip PVT variations on the performance parameters of a transmitter. The adaptive circuit 200 may be embodied within a circuit design of a conventional transmitter, such as an ASIC of a transmitter. The adaptive circuit 200 includes an oscillator 202, a counter 204, a pre-simulated count value 206, a comparison module 208, and a correction logic 210. These elements are shown as functional blocks, which can be implemented employing any of the components or designs in general use in the art. For example, those in the art will recognize the oscillator 202 could conveniently be fabricated as a voltage controlled oscillator (VCO). Similarly, the counter 204 could employ a conventional n-bit counter and latch circuit, or any other suitable device.

The adaptive circuit 200 receives a reference bias voltage $V_{CTRL}$ and adjusts an output drive signal of the transmitter compensating for on-chip PVT variations. Initially, the oscillator 202 receives $V_{CTRL}$ and converts it into a clock output signal. It will be appreciated by those skilled in the art that the value of $V_{CTRL}$ varies in response to the PVT variations, and thus the frequency of the clock output signal varies in response to variations in the value of $V_{CTRL}$. The counter 204 receives the clock output signal and generates a count value proportional to the clock output signal of the oscillator 202. Next, the comparison module 208 compares the count value with the pre-simulated count value 206 to generate an error signal. The pre-simulated count value 206 refers to a count value computed for a nominal PVT corner during transmitter design. Typically, pre-simulated count values are derived through simulation, employing computer-based design tools such as SPECTRE (produced by Cadence Corporation), HSPICE (by Synopsis Corporation) and the like. Such tools are well known to those in the art and are typically used to determine the performance and functionality of an IC design before committing that design to actual fabrication.

Using the error signal generated in the comparison module 208, the correction logic 210 adjusts the output drive signal, which compensates for non-linearity errors introduced in the transmitter due to the PVT variations. Some embodiments include changing the values of output drive current and output drive voltage depending on the adjustments in the output drive signal. Those skilled in the art will appreciate that an IC may employ more than one adaptive circuit for sensing and correcting on-chip PVT variations.

The adaptive circuit 200 performs two major functions: sensing PVT variations and minimizing the effect of those variations. These functions can be reflected in adaptive circuit design, producing the adaptive circuit 200 divided into two logic modules, a PVT sensing logic and a PVT correction logic. The PVT sensing logic will be described in the following section in connection with FIG. 3, and the PVT correction logic will be described in connection with FIG. 4.

Figure 3:
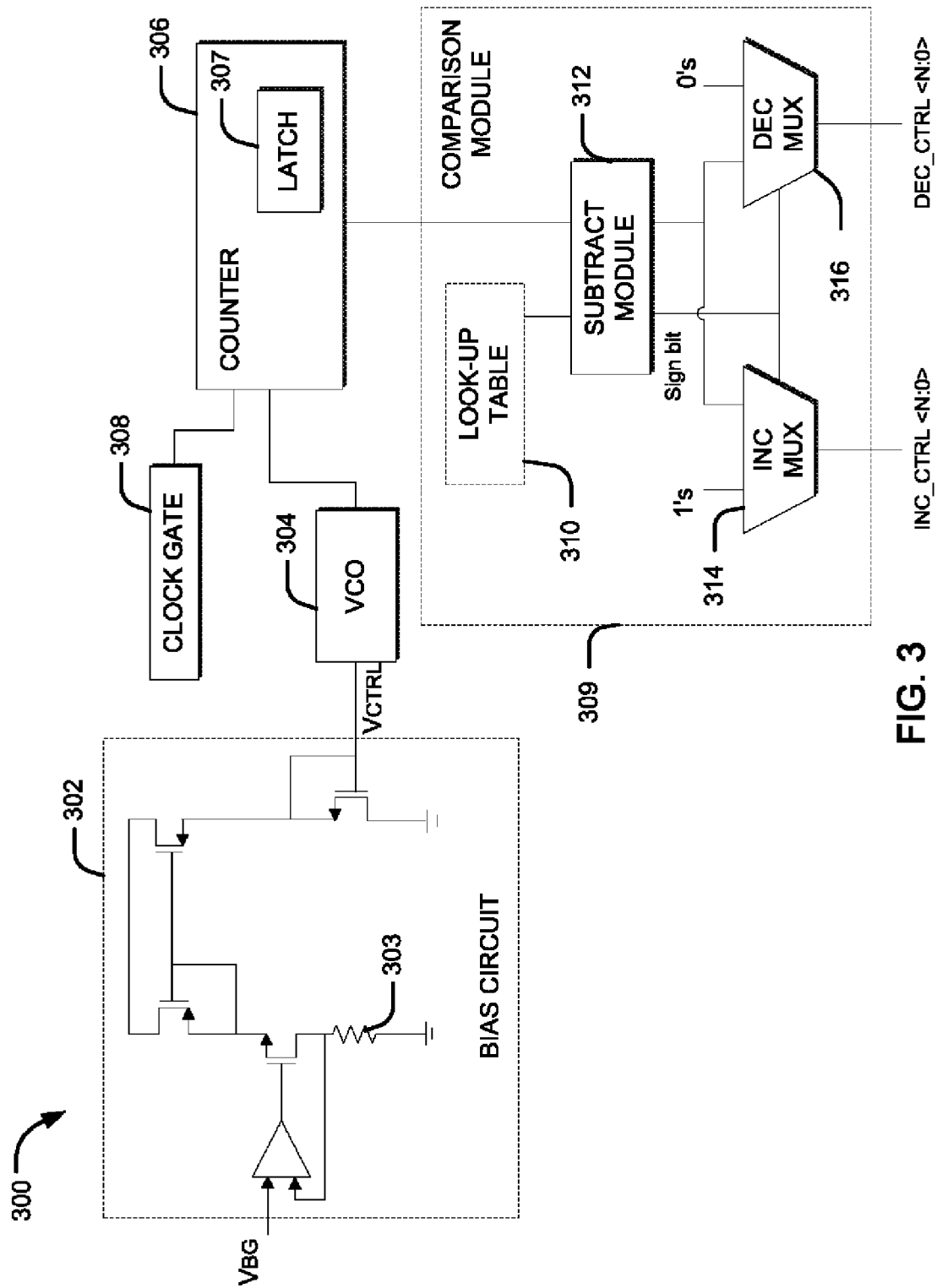
FIG. 3 illustrates an embodiment of a PVT sensing logic for sensing non-linearity errors induced in output voltage of a transmitter.

FIG. 3 illustrates an embodiment of a PVT sensing logic 300, for sensing non-linearity errors induced in an output voltage of a transmitter due to PVT variations. The transmitter includes a conventional bias circuit 302 that converts voltage into current. The bias circuit 302 is well known to those skilled in the art and will not be explained in detail here. The bias circuit 302 receives a standard reference bias voltage, referred to as band gap voltage $V_{BG}$, as input, which is converted into its equivalent reference current value using an operational amplifier in closed loop, as shown. The standard value of $V_{BG}$ is based on the nominal PVT corner, and the value of $V_{BG}$ varies with PVT parameters. In an exemplary embodiment, PVT variations affect resistance of a resistor 303 and in response the output voltage of the bias circuit 302 varies. The bias circuit 302 generates a reference bias voltage $V_{CTRL}$, which is supplied as an input control voltage to a VCO 304.

The reference bias voltage $V_{CTRL}$ is then converted into a count value by the VCO 304 and a counter 306. The VCO 304 first converts $V_{CTRL}$ into a clock output signal, whose frequency varies in response to changes in $V_{CTRL}$ and then the VCO output is provided as input to the counter 306, which generates a count value corresponding to the PVT parameters. The count value generated by the counter 306 varies with the VCO output frequency, corresponding to variations in the PVT parameters. The counter 306 shown in FIG. 3 can be an n-bit counter, including a latch circuit 307, where the latch 307 is preset to an initial state count value corresponding to the nominal PVT corner. The operation of the counter 306 is explained in detail in the following sections.

The PVT sensing logic 300 also includes a clock gate 308, which provides a gated clock signal to the counter 306. The gated clock signal enables the counter 306 throughout the operation of the transmitter after fabrication, and this gated clock signal is computed during simulation. The counter 306 counts the clock output signal until the gated clock signal is in high state, and it generates a count value when the gated clock signal goes low. The count value generated by the counter 306 is provided as an input to a comparison module 309 for computing an error signal. The comparison module 309 includes a look-up table 310, a subtract module 312, and a set of multiplexers, an increment multiplexer (INC MUX) 314 and a decrement multiplexer (DEC MUX) 316.

The IC design process includes simulation of IC characteristics and operating parameters, as noted above. Simulation of the PVT sensing logic 300 includes computing a reference count value corresponding to the nominal PVT corner, which can be accomplished by computing pulse width of the gated clock signal supplied by the clock gate 308 to the counter 306, using the VCO frequency at the nominal PVT corner. The transmitter simulation operates under the nominal PVT corner value to generate a count value referred to as a reference count value, which is stored in the look-up table 310. Further, reference count values may also be computed for each of the different PVT corners. It will be appreciated by a person skilled in the art that any data structure known in the art may be employed for storing the reference count values generated for all PVT corners. The operation of the adaptive circuit during simulation will be discussed in detail in connection with FIG. 6.

During on-chip operations, i.e., after fabrication, the PVT sensing logic 300 senses deviations in the count value computed by the counter 306 from the reference count value, where deviations correspond to any on-chip PVT variations. Initially, the counter 306 is preset to a predetermined state corresponding to the nominal PVT corner. The clock gate 308 provides a standard gated signal to the counter 306 (that is, the same output employed in the simulation). The counter 306 then generates a count value relating to the PVT condition at any point of time. The latch 307 is used as a memory element to store the count value corresponding to the falling edge of the gated clock signal. This latched count value generated by the counter 306 can be used to compute the amount of error introduced due to PVT drift. Next, the subtract module 312 subtracts the reference count value corresponding to the nominal PVT corner, computed during simulation, from the count value to generate an error count value with a sign bit value.

If the output of the counter 306 is less than the reference count value stored in the look-up table 310, the subtract module 312 generates an error count value and a negative sign bit value. A negative sign bit value indicates that at this point of time the transmitter is operating under PVT parameters that are less than the nominal PVT corner values. The error count value together with the negative sign bit value is provided to the increment multiplexer 314, which generates an n-bit increment error signal, referred to as INC_CTRL<N:0>.

If the output of the counter 306 is, however, greater than the reference count value in the look-up table 310, the subtract module 312 then generates an error count value with a null sign bit value. A null sign bit value indicates that the error count value is positive, meaning that that the transmitter is operating under PVT parameters that are greater than the nominal PVT corner values. The error count value is provided as input to the decrement multiplexer 316, which in turn creates an n-bit decrement error signal, referred to as DEC_CTRL<N:0>.

Thus, the PVT sensing logic 300 is configured to dynamically sense all non-linearity errors induced in output voltage of a transmitter due to on-chip PVT variations and generates either an increment error signal or a decrement error signal corresponding to the non-linearity error.

Figure 4:
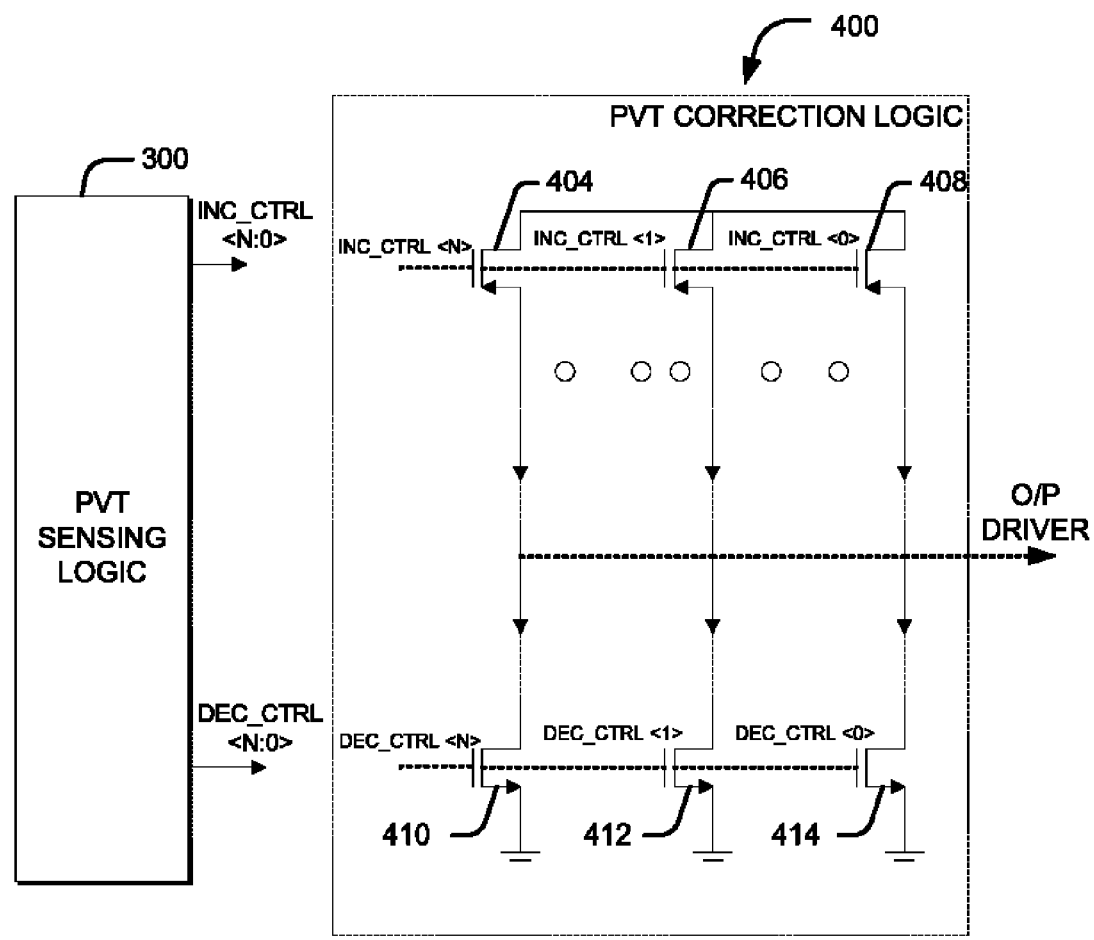
FIG. 4 illustrates an embodiment of a PVT correction logic for correcting non-linearity errors induced in output voltage of a transmitter.

FIG. 4 illustrates an embodiment of a PVT correction logic 400 for correcting non-linearity errors sensed employing the PVT sensing logic 300 in a transmitter. The PVT correction logic 400 receives either an increment error signal or a decrement error signal from the PVT sensing logic 300. The PVT correction logic 400 includes a set of p-type metal oxide semiconductor (PMOS) transistors, 404, 406, 408 and a set of n-type metal oxide semiconductor (NMOS) transistors 410, 412 and 414, where each pair of PMOS transistors and NMOS transistors is coupled in series to form fingers, coupled in parallel, as shown in FIG. 4. Each PMOS transistor 404, 406 and 408 receives one-bit signal from an n-bit increment error signal, INC_CTRL<N:0>, while each NMOS transistor 410, 412 and 414 receives one-bit signal from an n-bit decrement error signal, DEC_CTRL<N:0>. FIG. 4 depicts only a few of the PMOS and NMOS transistors for simplicity of discussion, however, a real scenario would include a large number of PMOS and NMOS transistors.

If the PVT correction logic 400 receives an n-bit increment error signal INC_CTRL<N:0> from the PVT sensing logic 300, then each bit of the increment error signal is connected to one of the PMOS transistors 404, 406, and 408 and some of the PMOS transistors 404, 406, and 408 are selectively turned ON depending on the value of bits of the INC_CTRL<N:0>. The turned ON PMOS transistors increase the output drive signal, which is supplied to an O/P driver of the transmitter. The output drive signal will change the value of the output drive voltage and an output drive current of the transmitter. The embodiment shown increases the total output drive current flowing to the O/P driver of the transmitter using the increment error signal and thereby compensates for all the non-linearity errors induced due to PVT variations.

If the PVT correction logic 400, however, receives an n-bit decrement error signal DEC_CTRL<N:0> from the PVT sensing logic 300, then each bit of the decrement error signal is connected to one of the NMOS transistors 410, 412 and 414 and some of the NMOS transistors 410, 412 and 414 are selectively turned ON based on the value of bits of the DEC_CTRL<N:0>. The turned ON NMOS transistors decrease the output drive signal, which is supplied to O/P driver of the transistors. As discussed, the output drive signal changes the value of the output drive voltage and an output drive current of the transmitter. The embodiment reduces the total output drive current flowing to the O/P driver of the transistor, and hence compensates for all the non-linearity errors induced due to PVT variations.

Therefore, the PVT correction logic 400 compensates for a decrease in the value of applicable PVT parameters from the nominal value by increasing the total output drive current flowing to the O/P driver of the transmitter. Conversely, the PVT correction logic 400 decreases the total output drive current flowing to the O/P driver of the transmitter to compensate for an increase in PVT parameters from the nominal value.

Figure 5:
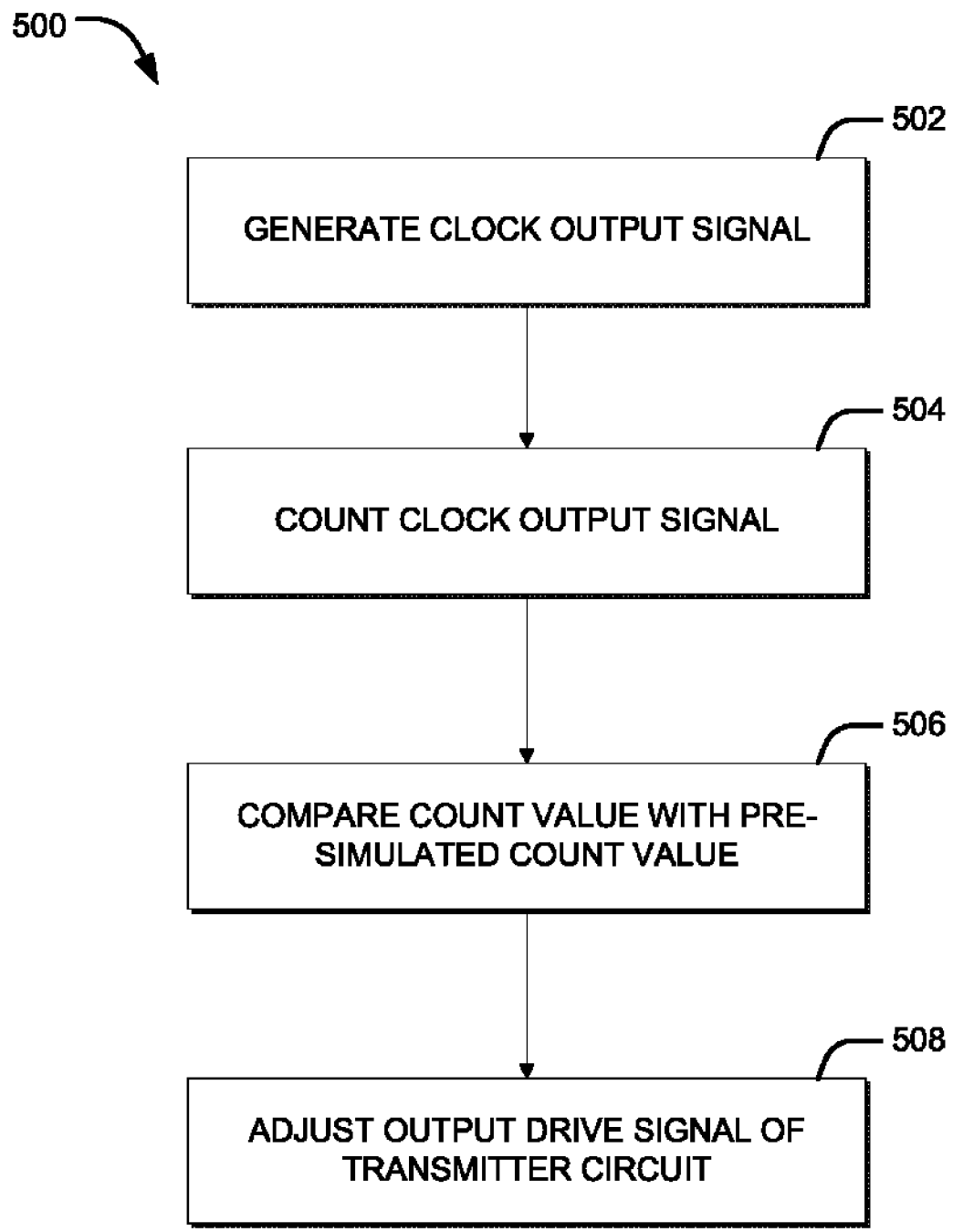
FIG. 5 is a flowchart of a method for minimizing effects of on-chip PVT variations on performance parameters of a transmitter.

FIG. 5 is a flowchart of a method 500 for minimizing effects of on-chip PVT variations on performance parameters of a transmitter employing the adaptive circuit 200, as discussed in connection with FIG. 2. At step 502, the adaptive circuit 200 generates a clock output signal from a reference bias voltage using the oscillator 202. The counter 204, as discussed in connection with the adaptive circuit 200, counts the clock output signal to generate a count value at step 504. At step 506 the adaptive circuit 200 compares the count value with a reference count value to compute an error value corresponding to PVT variations, employing the comparison module 208. Finally, at step 508 the correction logic 210 adjusts an output drive signal of the transmitter to reduce non-linearity errors based on the error signal generated at step 506.

Method 500 can be performed in two phases: a simulation phase and an on-chip calibration phase. The simulation phase includes computing reference count value for different PVT corners, whereas the on-chip calibration includes computing a count value corresponding to value of PVT parameters at any point of time during on-chip operations. The on-chip calibration phase also includes comparing the reference count value with the count value generated during on-chip operation to sense deviations induced due to PVT variations. The simulation phase is discussed in connection with FIG. 6 and the on-chip calibration phase is set out in the following sections in connection with FIG. 7.

Figure 6:
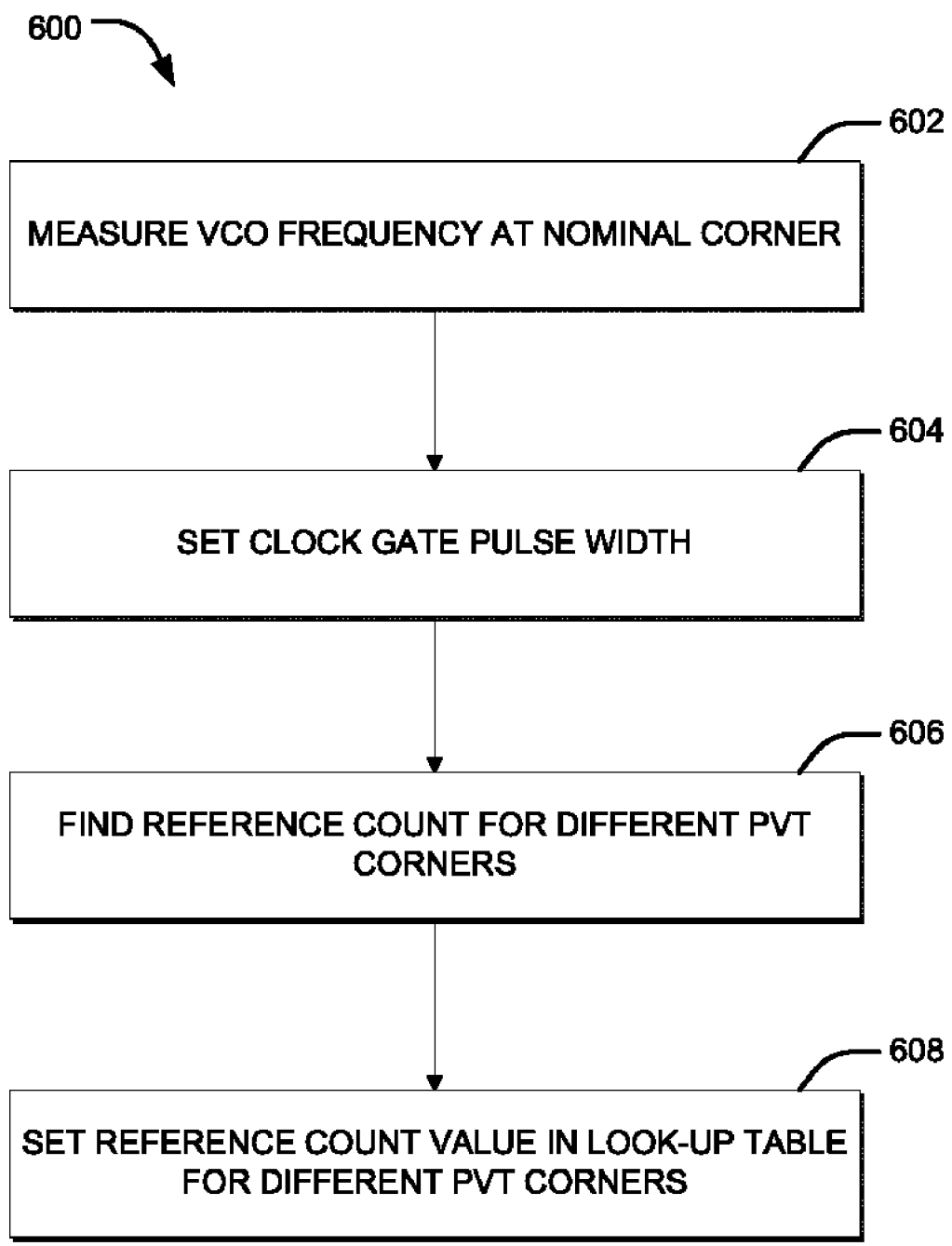
FIG. 6 is a flowchart depicting simulation phase of a method for minimizing non-linearity errors in a transmitter.

FIG. 6 is a flowchart depicting the simulation phase of a method 600 for minimizing non-linearity errors induced in output voltage response of a transmitter. It will be understood by those skilled in the art that the simulation phase is conducted on a simulation tool, during the design of an IC, as discussed above. Thus, in the following discussion, all system elements are simulated and are not the actual elements shown in, for example, FIG. 2.

The simulation phase includes computing reference count values for different PVT corners. At step 602, an adaptive circuit measures the frequency of a VCO at nominal corner. At step 604, the adaptive circuit calculates pulse width of a gated clock signal according to the value of the VCO frequency at nominal corner, as discussed in connection with a clock gate. The clock gate, as already discussed, generates a gated clock signal using the pulse width computed at step 604, and this gated clock signal is then supplied to an n-bit counter and a latch circuit for counting the clock output of the VCO. The embodiment computes the pulse width using the following formula:

$$\text{clock gate pulse width} = (2^N)/2 * \text{VCO frequency@nominal corner where N=number of counter bits} \quad (1)$$

It is well known to those skilled in the art that an IC's performance varies with performance parameters, and the performance of the IC may vary from the best case to the worst case with PVT parameters varying from best case corner to the worst case corner respectively. For example, an IC's output current corresponding to the best case PVT corner is higher than the IC's output current corresponding to the worst case PVT corner. A nominal corner, however, exists for PVT parameters that result in an optimized output current for any IC. Thus, an IC is simulated under all PVT corners to characterize and verify the performance of the IC. At step 606, the adaptive circuit computes reference count values for different PVT corners. Next, at step 608 all the reference count values corresponding to different PVT corners are stored in a look-up table. These reference count values are employed as a reference to determine the PVT condition at any point of time during on-chip operation. In an exemplary embodiment, a 4-bit counter may generate a count value of 1000 for nominal corner, 1110 for best case corner, and 0100 for worst case corner.

Figure 7:
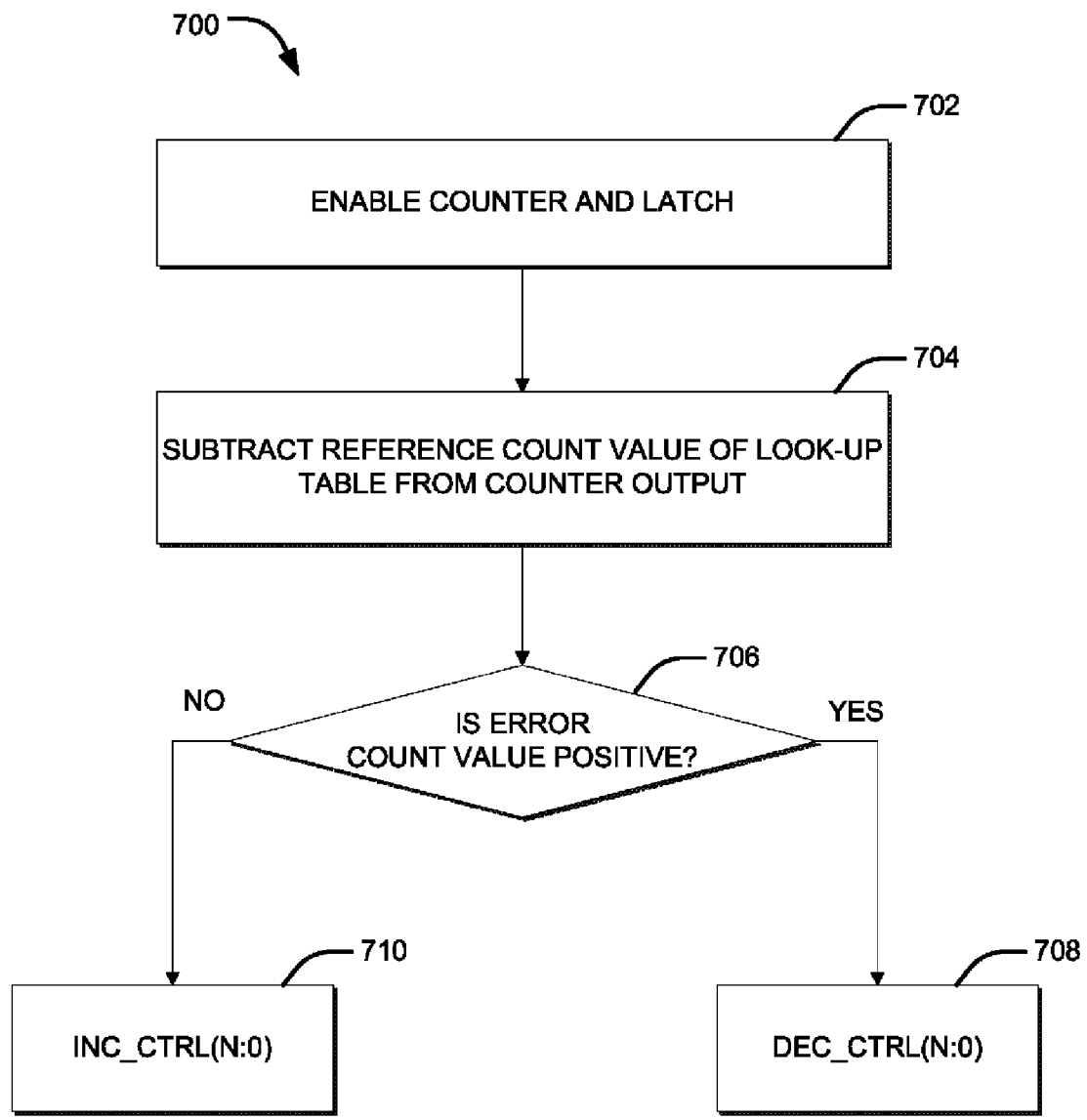
FIG. 7 is a flowchart depicting on-chip calibration phase of the method for minimizing non-linearity errors in a transmitter.
Figure 8:
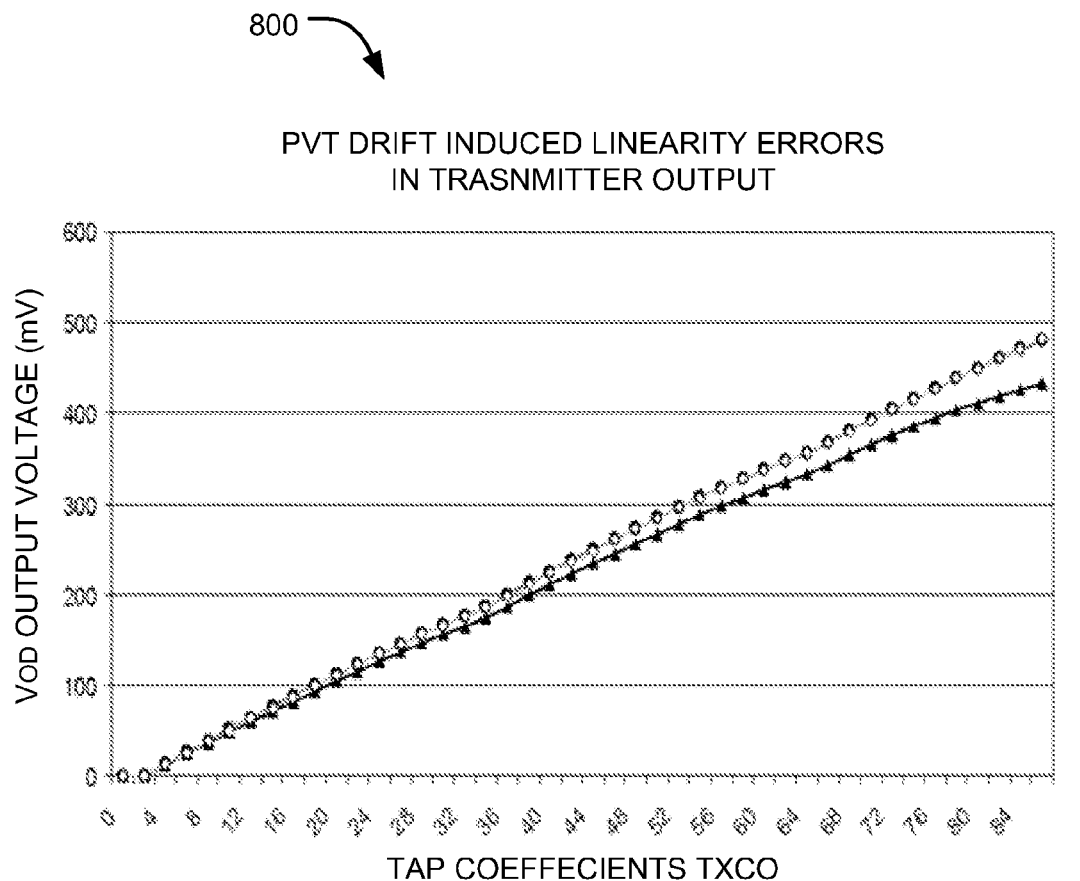
FIG. 8 is a graph depicting PVT drift introduced linearity errors in transmitter output

FIG. 7 is a flowchart depicting the on-chip calibration phase of a method 700 for minimizing non-linearity errors induced in a transmitter. During on-chip calibration phase, also referred to as post fabrication phase, an adaptive circuit operates to generate a count value corresponding to PVT conditions at any point of time and compensates for all deviations in the PVT conditions from their nominal values. As discussed, with variations in PVT parameters the count value generated using the adaptive circuit also varies.

During the on-chip calibration operation, at step 702 the adaptive circuit enables a counter and latch circuit to generate a count value corresponding to PVT condition at any point of time. The adaptive circuit provides the gated clock signal generated at step 604 (FIG. 6) to the counter, and the latch circuit is preset to a known initial state count value corresponding to the nominal corner, as computed during simulation phase. At step 704, the adaptive circuit subtracts the reference value corresponding to the nominal PVT corner computed at step 608 (FIG. 6) from the count value generated by the counter. The subtraction of the reference count value from the count value results in an error count value and a sign bit value. Next at 706, the adaptive circuit checks whether the error count value is positive or negative, i.e., the adaptive circuit verifies whether the sign bit value is a positive value or a negative value. If the sign bit generated is positive, then at step 708, the adaptive circuit generates an n-bit decrement error value, referred to as DEC_CTRL<N:0>. If the sign bit generated is negative, however, then at step 710, the adaptive circuit generates an n-bit increment error value, referred to as INC_CTRL<N:0>.

Thus, the invention dynamically senses and corrects all non-linearity errors induced in output voltage response of a SerDes transmitter due to on-chip PVT variations, making the SerDes transmitter immune to PVT variations.

It should be noted that the materials set out above constitute functional descriptions of the various embodiments of methods of the claimed invention. Those of skill in the art will be able to put those descriptions into concrete form, using a variety of computer languages, coding languages, methods and tools. No best method for performing this process is known, and it is believed that any of the well-known methods and formats available to the art will suffice to produce operating examples of systems embodying the claimed invention.

Thus, it is apparent that there has been provided, with various embodiments of the invention, a methodology for sensing and correcting PVT variations induced into a transmitter, which results in non-linear output voltage response of the transmitter. Although the invention has been described in detail, it should be understood that various changes, substitutions, and alterations may be readily ascertainable by those skilled in the art and such alterations may be made without departing from the spirit and scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A circuit for minimizing non-linearity errors induced in output drive voltage of a transmitter circuit due to on-chip process, voltage and temperature (PVT) variations, comprising:
an oscillator configured to convert an input reference bias voltage into a clock output, wherein the input reference bias voltage varies in response to PVT variations, and frequency of the clock output varies according to changes in the input reference bias voltage; a counter configured to receive input from the oscillator and generate a count value corresponding to the clock output of the oscillator; a comparison module configured to generate an error signal, the error signal is calculated by comparing the count value with a pre-simulated count value; and a correction logic configured to adjust an output drive signal of the transmitter circuit based on the error signal.

2. The circuit of claim 1, wherein the comparison module includes:
a look-up table containing a set of pre-simulated count values;
a subtract module configured to subtract the pre-simulated count value from the count value; and
a set of multiplexers configured to generate the error signal.

3. The circuit of claim 2, wherein the error signal is an increment error signal upon a determination that the count value is a positive value, and the error signal is a decrement error signal upon a determination that the count value is a negative value.

4. The circuit of claim 3, wherein the correction logic is configured to increase the output drive signal of the transmitter circuit upon a determination that the error signal is an increment error signal.

5. The circuit of claim 3, wherein the correction logic is configured to decrease the output drive signal of the transmitter circuit upon a determination that the error signal is a decrement error signal.

6. The circuit of claim 1, wherein the oscillator is a voltage controlled oscillator (VCO).

7. The circuit of claim 1, wherein the counter includes:
an n-bit counter; and
a latch, the latch preset to a known preloaded initial state count value during calibration phase.

8. The circuit of claim 1, wherein the output drive signal adjusts at least one of the output drive voltage and an output drive current of the transmitter circuit.

9. A method for minimizing non-linearity errors induced in output drive voltage of a transmitter due to on-chip process, voltage and temperature (PVT) variations, the method comprising:
generating a clock output signal from an input reference bias voltage, frequency of the clock output signal varying in response to PVT variations;
counting the clock output signal to generate a count value;
comparing the count value with a pre-simulated count value to generate an error signal; and
adjusting an output drive signal of the transmitter circuit based on the generated error signal.

10. The method of claim 9, wherein the pre-simulated count value is contained in a look-up table.

11. The method of claim 9, wherein the error signal is an increment error signal upon a determination that the count value is less than the pre-simulated count value, and the error signal is a decrement error signal upon a determination that the count value is greater than the pre-simulated count value.

12. The method of claim 11, wherein the adjusting step includes increasing the output drive signal of the transmitter circuit upon a determination that the error signal is an increment error signal.

13. The method of claim 11, wherein the adjusting step includes decreasing the output drive signal of the transmitter circuit upon a determination that the error signal is a decrement error signal.

14. The method of claim 9, wherein the adjusting step adjusts at least one of the output drive voltage and an output drive current of the transmitter circuit.

* * * * *